United States Patent
Narendran et al.

(10) Patent No.: US 7,750,359 B2
(45) Date of Patent: Jul. 6, 2010

(54) PACKAGE DESIGN FOR PRODUCING WHITE LIGHT WITH SHORT-WAVELENGTH LEDS AND DOWN-CONVERSION MATERIALS

(75) Inventors: Nadarajah Narendran, Clifton Park, NY (US); Yimin Gu, Troy, NY (US)

(73) Assignee: Rensselaer Polytechnic Institute, Troy, NY (US)

( * ) Notice: Subject to any disclaimer, the term of this patent is extended or adjusted under 35 U.S.C. 154(b) by 594 days.

(21) Appl. No.: 11/795,171

(22) PCT Filed: Jun. 20, 2006

(86) PCT No.: PCT/US2006/024210

§ 371 (c)(1),
(2), (4) Date: Jul. 12, 2007

(87) PCT Pub. No.: WO2007/002234

PCT Pub. Date: Jan. 4, 2007

(65) Prior Publication Data

US 2008/0105887 A1    May 8, 2008

Related U.S. Application Data

(60) Provisional application No. 60/693,170, filed on Jun. 23, 2005, provisional application No. 60/698,591, filed on Jul. 12, 2005.

(51) Int. Cl.
*H01L 33/00* (2010.01)
(52) U.S. Cl. .......... 257/98; 257/E21.001; 257/E33.001
(58) Field of Classification Search .................. 257/98, 257/E21.001, E23.001
See application file for complete search history.

(56) References Cited

U.S. PATENT DOCUMENTS 3,593,055 A    7/1971    Geusie et al.

(Continued)

FOREIGN PATENT DOCUMENTS

DE    3632743 A1    3/1998

(Continued)

OTHER PUBLICATIONS

United States Patent and Trademark Office Office Action in U.S. Appl. No. 10/583,105 dated Jun. 19, 2009.

(Continued)

*Primary Examiner*—Trung Dang
(74) *Attorney, Agent, or Firm*—RatnerPrestia

(57) ABSTRACT

A broad bandwidth light source including: a solid state light emitting device that generates short wavelength light; and quantum dot material and phosphor material that are each irradiated by some of the short wavelength light. The short wavelength light has a spectrum with a first peak wavelength shorter than about 500 nm. The quantum dot material absorbs some of the short wavelength light and reemits it as long wavelength light having a spectrum with a second peak wavelength longer than about 600 nm. The phosphor material absorbs some of the short wavelength light and reemits it as mid wavelength light having a spectrum with a peak wavelength between the first and second peak wavelength. The light source is configured such that some of each light (short, mid, and long wavelength) is emitted coincidentally as a light having a chromaticity value near the blackbody locus and a color rendering index greater than 80.

38 Claims, 7 Drawing Sheets

U.S. PATENT DOCUMENTS

| | | |
|---|---|---|
| 3,760,237 A | 9/1973 | Jaffe |
| 3,763,405 A | 10/1973 | Mitsuhata |
| 3,875,456 A | 4/1975 | Kano et al. |
| 4,729,076 A | 3/1988 | Masami et al. |
| 5,187,765 A | 2/1993 | Muehlemann et al. |
| 5,208,462 A | 5/1993 | O'Connor et al. |
| 5,461,547 A | 10/1995 | Ciupke et al. |
| 5,477,430 A | 12/1995 | LaRose |
| 5,499,138 A | 3/1996 | Iba |
| 5,535,230 A | 7/1996 | Abe |
| 5,622,423 A | 4/1997 | Lee |
| 5,777,433 A | 7/1998 | Lester et al. |
| 5,808,409 A | 9/1998 | Matsuda et al. |
| 5,813,752 A | 9/1998 | Singer |
| 5,813,753 A | 9/1998 | Vriens et al. |
| 5,847,507 A | 12/1998 | Butterworth et al. |
| 5,959,316 A | 9/1999 | Lowery |
| 5,962,971 A | 10/1999 | Chen |
| 5,998,925 A | 12/1999 | Shimizu et al. |
| 6,007,209 A | 12/1999 | Pelka |
| 6,066,861 A | 5/2000 | Höhn et al. |
| 6,068,383 A | 5/2000 | Robertson et al. |
| 6,069,440 A | 5/2000 | Shimizu et al. |
| 6,084,250 A | 7/2000 | Jüstel et al. |
| 6,096,496 A | 8/2000 | Frankel |
| 6,155,699 A | 12/2000 | Miller et al. |
| 6,210,012 B1 | 4/2001 | Broer |
| 6,245,259 B1 | 6/2001 | Höhn et al. |
| 6,252,254 B1 | 6/2001 | Soules et al. |
| 6,294,800 B1 | 9/2001 | Duggal et al. |
| 6,350,041 B1 | 2/2002 | Tarsa et al. |
| 6,357,889 B1 | 3/2002 | Duggal et al. |
| 6,452,217 B1 | 9/2002 | Wojnarowski et al. |
| 6,469,322 B1 | 10/2002 | Srivastava et al. |
| 6,483,196 B1 | 11/2002 | Wojnarowski et al. |
| 6,491,412 B1 | 12/2002 | Bowman et al. |
| 6,501,102 B2 | 12/2002 | Mueller-Mach et al. |
| 6,513,949 B1 | 2/2003 | Marshall et al. |
| 6,576,930 B2 | 6/2003 | Reeh et al. |
| 6,576,935 B2 | 6/2003 | Onishi et al. |
| 6,580,097 B1 | 6/2003 | Soules et al. |
| 6,580,224 B2 | 6/2003 | Ishii et al. |
| 6,600,175 B1 | 7/2003 | Baretz et al. |
| 6,603,258 B1 | 8/2003 | Mueller-Mach et al. |
| 6,608,332 B2 | 8/2003 | Shimizu et al. |
| 6,614,170 B2 | 9/2003 | Wang et al. |
| 6,614,179 B1 | 9/2003 | Shimizu et al. |
| 6,616,862 B2 | 9/2003 | Srivastava et al. |
| 6,630,691 B1 | 10/2003 | Mueller-Mach et al. |
| 6,635,363 B1 | 10/2003 | Duclos et al. |
| 6,635,987 B1 | 10/2003 | Wojnarowski et al. |
| 6,653,765 B1 | 11/2003 | Levinson et al. |
| 6,686,676 B2 | 2/2004 | McNulty et al. |
| 6,686,691 B1 | 2/2004 | Mueller et al. |
| 6,692,136 B2 | 2/2004 | Marshall et al. |
| 6,696,703 B2 | 2/2004 | Mueller-Mach et al. |
| 6,734,467 B2 | 5/2004 | Schlereth et al. |
| 6,791,259 B1 | 9/2004 | Stokes et al. |
| 6,793,374 B2 | 9/2004 | Begemann |
| 6,796,690 B2 | 9/2004 | Bohlander |
| 6,799,865 B2 | 10/2004 | Ellens et al. |
| 6,809,342 B2 | 10/2004 | Harada |
| 6,833,565 B2 | 12/2004 | Su et al. |
| 6,867,542 B1 | 3/2005 | Sun et al. |
| 6,936,857 B2 | 8/2005 | Doxsee et al. |
| 7,002,291 B2 | 2/2006 | Ellens et al. |
| 7,026,656 B2 | 4/2006 | Lin et al. |
| 7,040,774 B2 | 5/2006 | Beeson et al. |
| 7,048,385 B2 | 5/2006 | Beeson et al. |
| 7,049,740 B2 | 5/2006 | Takekuma |
| 7,052,152 B2 | 5/2006 | Harbers et al. |
| 7,192,161 B1 | 3/2007 | Cleaver et al. |
| 7,498,734 B2 | 3/2009 | Suehiro et al. |
| 2002/0003233 A1 | 1/2002 | Mueller-Mach et al. |
| 2002/0030444 A1 | 3/2002 | Muller-Mach et al. |
| 2002/0047516 A1 | 4/2002 | Iwasa et al. |
| 2002/0084745 A1 | 7/2002 | Wang et al. |
| 2002/0167014 A1 | 11/2002 | Schlereth et al. |
| 2003/0030060 A1 | 2/2003 | Okazaki |
| 2003/0067773 A1 | 4/2003 | Marshall et al. |
| 2003/0127660 A1 | 7/2003 | Bawendi et al. |
| 2003/0174499 A1 | 9/2003 | Bohlander |
| 2003/0189829 A1 | 10/2003 | Shimizu et al. |
| 2003/0201451 A1 | 10/2003 | Suehiro et al. |
| 2003/0203524 A1 | 10/2003 | Farahi et al. |
| 2003/0218880 A1 | 11/2003 | Brukilacchio |
| 2003/0227249 A1* | 12/2003 | Mueller et al. ............... 313/491 |
| 2003/0230751 A1 | 12/2003 | Harada |
| 2004/0016938 A1 | 1/2004 | Baretz et al. |
| 2004/0027062 A1 | 2/2004 | Shiang et al. |
| 2004/0056260 A1 | 3/2004 | Slater, Jr. et al. |
| 2004/0116033 A1 | 6/2004 | Ouderkirk et al. |
| 2004/0124758 A1 | 7/2004 | Danielson et al. |
| 2004/0129945 A1 | 7/2004 | Uemura |
| 2004/0203312 A1 | 10/2004 | Bortscheller et al. |
| 2004/0208210 A1 | 10/2004 | Inoguchi |
| 2004/0217364 A1 | 11/2004 | Tarsa |
| 2004/0233664 A1 | 11/2004 | Beeson et al. |
| 2004/0245912 A1 | 12/2004 | Thurk et al. |
| 2004/0263073 A1 | 12/2004 | Baroky et al. |
| 2004/0263074 A1 | 12/2004 | Baroky et al. |
| 2005/0041424 A1 | 2/2005 | Ducharme |
| 2005/0073495 A1 | 4/2005 | Harbers et al. |
| 2005/0093430 A1 | 5/2005 | Ibbetson et al. |
| 2005/0116635 A1 | 6/2005 | Walson et al. |
| 2005/0117125 A1 | 6/2005 | Minano et al. |
| 2005/0117366 A1 | 6/2005 | Simbal |
| 2005/0135079 A1 | 6/2005 | Yin Chua et al. |
| 2005/0135117 A1 | 6/2005 | Lamb et al. |
| 2005/0162849 A1 | 7/2005 | Keuper |
| 2005/0174775 A1 | 8/2005 | Conner |
| 2005/0185419 A1 | 8/2005 | Holman et al. |
| 2005/0211991 A1 | 9/2005 | Mori et al. |
| 2005/0219476 A1 | 10/2005 | Beeson et al. |
| 2005/0237488 A1 | 10/2005 | Yamasaki et al. |
| 2005/0248958 A1 | 11/2005 | Li |
| 2005/0265029 A1 | 12/2005 | Epstein et al. |
| 2005/0276553 A1 | 12/2005 | Kazakevich |
| 2005/0280785 A1 | 12/2005 | Beeson et al. |
| 2006/0002141 A1 | 1/2006 | Ouderkirk et al. |
| 2006/0007553 A1 | 1/2006 | Bogner |
| 2006/0034082 A1 | 2/2006 | Park et al. |
| 2006/0034084 A1 | 2/2006 | Matsuura et al. |
| 2006/0044523 A1 | 3/2006 | Teijido et al. |
| 2006/0044803 A1 | 3/2006 | Edwards |
| 2006/0049416 A1 | 3/2006 | Baretz et al. |
| 2006/0066192 A1 | 3/2006 | Beeson et al. |
| 2006/0066210 A1* | 3/2006 | Ng et al. ..................... 313/486 |
| 2006/0067078 A1 | 3/2006 | Beeson et al. |
| 2006/0071225 A1 | 4/2006 | Beeson et al. |
| 2006/0072314 A1 | 4/2006 | Rains |
| 2006/0081862 A1 | 4/2006 | Chua et al. |
| 2006/0091788 A1 | 5/2006 | Yan |
| 2006/0097385 A1 | 5/2006 | Negley |
| 2006/0104090 A1 | 5/2006 | Lengyel et al. |
| 2006/0118805 A1 | 6/2006 | Camras et al. |
| 2006/0170335 A1 | 8/2006 | Cho et al. |
| 2006/0186429 A1 | 8/2006 | Chew |
| 2006/0202219 A1 | 9/2006 | Ohashi et al. |
| 2008/0231170 A1* | 9/2008 | Masato et al. ............... 313/501 |

| | | |
|---|---|---|
| 2008/0310158 A1 | 12/2008 | Harbers et al. |

FOREIGN PATENT DOCUMENTS

| | | |
|---|---|---|
| DE | 102 61 428 A1 | 7/2004 |
| EP | 1 160 883 A | 12/2001 |
| EP | 1 369 935 A1 | 12/2003 |
| EP | 1 686 630 A | 8/2006 |
| EP | 1 691 425 A | 8/2006 |
| EP | 1 696 496 A | 8/2006 |
| JP | 2001-243807 | 9/2001 |
| JP | 2001-243821 | 9/2001 |
| JP | 2002-299694 | 10/2002 |
| JP | 2004-055160 | 2/2004 |
| JP | 2004/055229 | 2/2004 |
| WO | WO 00/24064 A | 4/2000 |
| WO | WO 01/40702 A1 | 6/2001 |
| WO | WO 2005/107420 | 11/2005 |
| WO | WO 2006/087651 | 8/2006 |

OTHER PUBLICATIONS

English language translation of the Third Office Action in Chinese Patent Application No. 200580022283.9 mailed on Jan. 22, 2010.
United States Patent and Trademark Office Office Action in U.S. Appl. No. 11/642,154 dated Jun. 2, 2009.
USPTO Office Action in U.S. Appl. No. 11/644,815 dated Feb. 3, 2009.
USPTO Office Action in U.S. Appl. No. 11/642,089 dated Jul. 23, 2009.
European Office Action in EP Application No. 05 761 021.4 dated Oct. 8, 2009.
USPTO Office Action in U.S. Appl. No. 11/644,815 dated Sep. 18, 2009.
Chen et al., InGaN-CdSe-ZnSe Quantum Dots White LEDs, IEEE Photonics Technology Letters IEEE USA, vol. 18, No. 1, Jan. 2006, pp. 193-195.
International Search Report for PCT International Application No. PCT/US2006/024210 mailed Oct. 12, 2006.
United States Patent and Trademark Office Office Action for U.S. Appl. No. 11/642,089 dated Mar. 10, 2009.
Song Jae Lee, Study of Photon Extraction Efficiency in InGaN Light-Emitting Diodes Depending on Chip Structures and Chip-Mount Schemes, Optical Engineering, Jan. 2006, vol. 45(1), pp. 014601-1-014601-14.
Search Report from International Application Serial No. PCT/US2007/012311 dated Feb. 15, 2008.
International Search Report of PCT International Application No. PCT/US2005/015736 dated Mar. 30, 2006 (3 pages).
Kim J.K. et al: "Strongly Enhanced Phosphor Efficiency in GaInN White Light-Emitting Diodes Using Remote Phosphor configuration and Diffuse Reflector Cup" Japanese Journal of Applied Physics, Part 2 (Letters) Japan Soc. Appl. Phys Japan, vol. 44, No. 21, 2005, pp. L649-L651.
Search Report for International Application Serial No. PCT/US2007/013132 dated Dec. 3, 2007.
Krames M.R. et al.: "High-power III-nitride emitters for solid-state lighting" Phys. Stat. sol. (a) Wiley-VCH Verlag Berlin GmbH, Berlin, vol. 192, No. 2 (2002) pp. 237-245.
Search Report for International Application Serial No. PCT/US2007/013132 dated Jan. 31, 2008.
European Search Report of Application No. EP 05 76 1021 dated Jun. 18, 2008.
International Search Report for PCT International Application No. PCT/US05/15736 mailed Mar. 30, 2006.
First Office Action for Chinese Application No. 2005800222839 dated Jul. 8, 2008 (including English translation).
United States Patent and Trademark Office Office Action for U.S. Appl. No. 11/642,089 dated May 28, 2008.
United States Patent and Trademark Office Office Action for U.S. Appl. No. 11/642,154 dated Sep. 25, 2008.
Akos Borbely, et al., Prediction of Light Extraction Efficiency of LEDs by Ray Trace Simulation, Third International Conference on Solid State Lighting, Proc. Of SPIE vol. 5187, pp. 301-308 (2004)*.
D.A. Vanderwater et al., High-Brightness AlGaInP Light Emitting Diodes, Proceedings of the IEE, vol. 85, No. 11, Nov. 1997, pp. 1752-1764.
Kenichi Yamada et al., Optical Simulation of Light Source Devices Composed of Blue LEDs and YAG Phosphor, J. Light & Vis. Env. vol. 27, No. 2, 2003, pp. 70-74.
N. Narendran et al., Solid-state Lighting: failure analysis of white LEDs, Journal of Crystal Growth, 268 (2004) pp. 449-456.
M. Arik et al., Effects of Localized Heat Generations Due to the Color Conversion in Phosphor Particles and Layers of High Brightness Light Emitting Diodes, American Society of Mechanical Engineers (ASME), Proceedings of InterPACK '03, International Electronic Packaging Technical Conference and Exhibition, Maui, Hawaii, Jul. 2003, pp. 1-9, title page, copyright page and abstract page.
United States Patent and Trademark Office Office Action of U.S. Appl. No. 10/583,105 dated Nov. 4, 2008.

* cited by examiner

US 7,750,359 B2

PACKAGE DESIGN FOR PRODUCING WHITE LIGHT WITH SHORT-WAVELENGTH LEDS AND DOWN-CONVERSION MATERIALS

RELATED APPLICATION

This application is a U.S. National Phase Application of PCT International Application No. PCT/US2006/024210, filed Jun. 20, 2006, which claims the benefit of priority to U.S. Provisional Application Ser. No. 60/693,170, filed Jun. 23, 2005 and to U.S. Provisional Application No. 60/698,591, filed Jul. 12, 2005, the contents of each being incorporated by reference herein.

FIELD OF THE INVENTION

The present invention concerns solid-state white light emitting devices. In particular, these devices and methods use a short wavelength light source with both phosphor and quantum dot down conversion materials.

BACKGROUND OF THE INVENTION

Solid state light emitting devices, including solid state lamps having light emitting diodes (LED's) and resonant cavity LED's (RCLED's) are extremely useful, because they potentially offer lower fabrication costs and long term durability benefits over conventional incandescent and fluorescent lamps. Due to their long operation (burn) time and low power consumption, solid state light emitting devices frequently provide a functional cost benefit, even when their initial cost is greater than that of conventional lamps. Because large scale semiconductor manufacturing techniques may be used, many solid state lamps may be produced at extremely low cost.

In addition to applications such as indicator lights on home and consumer appliances, audiovisual equipment, telecommunication devices and automotive instrument markings, LED's have found considerable application in indoor and outdoor informational displays.

With the development of efficient LED's that emit blue or ultraviolet (UV) light, it became feasible to produce LED's that generate white light through phosphor conversion of a portion of the primary emission of the LED to longer wavelengths. Conversion of primary emissions of the LED to longer wavelengths is commonly referred to as down-conversion of the primary emission. An unconverted portion of the primary emission combines with the light of longer wavelength to produce light that may appear white to a viewer. However, using only inorganic phosphors to down-convert short wavelength light, the types of spectra that may be produced efficiently are limited.

SUMMARY OF THE INVENTION

An exemplary embodiment of the present invention is a method of producing visible light using a short wavelength solid state light emitting device, a quantum dot material and a phosphor material, where the visible light has a chromaticity value near the blackbody locus and a color rendering index greater than about 80. Short wavelength light having a first spectrum with a first peak wavelength is generated using the short wavelength solid state light emitting device. The first peak wavelength is shorter than about 500 nm. The quantum dot material is irradiated with at least a portion of the short wavelength light such that a first fraction of the short wavelength light is absorbed and reemitted by the quantum dot material as long wavelength light having a second spectrum with a second peak wavelength. The second peak wavelength is longer than about 600 nm. The phosphor material is irradiated with at least a portion of the short wavelength light such that a second fraction of the short wavelength light is absorbed and reemitted by the phosphor material as mid wavelength light having a third spectrum with a third peak wavelength. The third peak wavelength is between the first peak wavelength and the second peak wavelength. A third fraction of the short wavelength light, at least a portion of the mid wavelength light and at least a portion of the long wavelength light are emitted as the visible light.

Another exemplary embodiment of the present invention is a broad bandwidth light source including: a short wavelength solid state light emitting device; a quantum dot material optically coupled to the short wavelength solid state light emitting device to be irradiated by a first portion of the short wavelength light; and a phosphor material optically coupled to the short wavelength solid state light emitting device to be irradiated by a second portion of the short wavelength light. The short wavelength solid state light emitting device generates short wavelength light having a first spectrum with a first peak wavelength that is shorter than about 500 nm. The quantum dot material is adapted to absorb a fraction of incident light having the first spectrum and reemit it as long wavelength light having a second spectrum with a second peak wavelength that is longer than about 600 nm. The phosphor material is adapted to absorb a fraction of incident light having the first spectrum and reemit it as mid wavelength light having a third spectrum with a peak wavelength that is between the first peak wavelength and the second peak wavelength. The short wavelength solid state light emitting device, the quantum dot material, and the phosphor material are configured such that some of the short wavelength light, some of the long wavelength light, and some of the mid wavelength light are emitted substantially coincidentally from the broad bandwidth light source as a visible light having a chromaticity value near the blackbody locus and a color rendering index greater than 80.

A further exemplary embodiment of the present invention is a broad bandwidth light source for producing visible light having a chromaticity value near a blackbody locus and a color rendering index greater than about 80. The broad bandwidth light source includes: means for generating short wavelength light having a first spectrum with a first peak wavelength; means for absorbing and reemitting a first fraction of the short wavelength light as long wavelength light having a second spectrum with a second peak wavelength; and means for absorbing and reemitting a second fraction of the short wavelength light as mid wavelength light having a third spectrum with a third peak wavelength. The first peak wavelength is shorter than about 500 nm, the second peak wavelength is longer than about 600 nm, and the third peak wavelength is between the first peak wavelength and the second peak wavelength. A third fraction of the short wavelength light, at least a portion of the mid wavelength light, and at least a portion of the long wavelength light are emitted as the visible light.

BRIEF DESCRIPTION OF THE DRAWINGS

The invention is best understood from the following detailed description when read in connection with the accompanying drawings. It is emphasized that, according to common practice, the various features of the drawings are not to scale. On the contrary, the dimensions of the various features are arbitrarily expanded or reduced for clarity. Included in the drawing are the following figures.

DETAILED DESCRIPTION OF THE INVENTION

Figure 1:
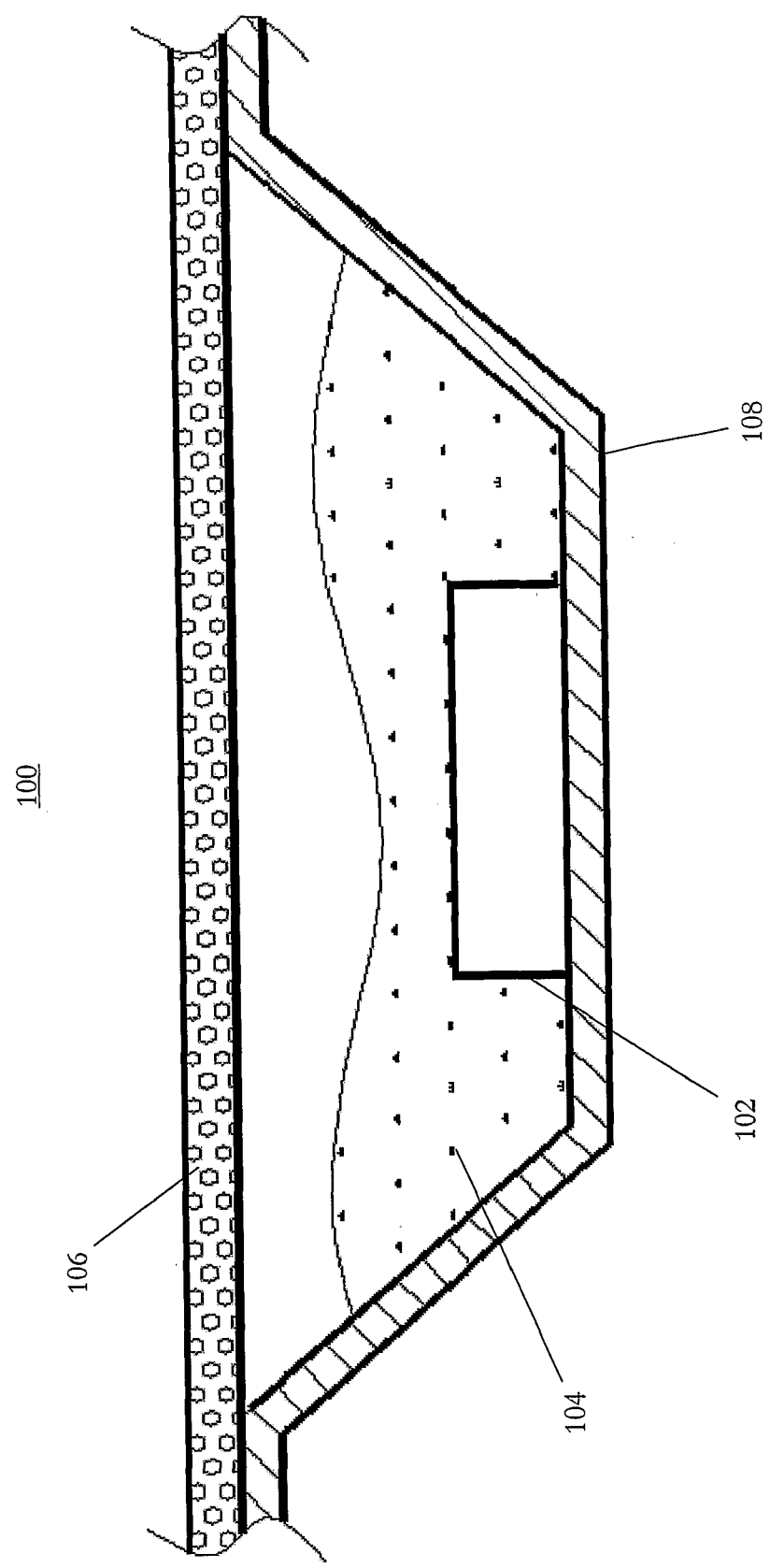
FIG. 1 is a cut away side plan drawing illustrating an exemplary broad bandwidth light source according to an exemplary embodiment of the present invention.

Research into solid-state lighting aims not only to develop energy efficient light sources, but also light sources capable of emitting white light that mimics a sunlight spectrum. However, it has been difficult to achieve this type of spectrum efficiently using only inorganic phosphors to down-convert short wavelength light. For example, white LED's using a cerium doped yttrium aluminum garnet (YAG:Ce) phosphor with a gallium nitride (GaN) based blue LED have been produced. In these prior art light sources, a portion of the blue radiation emitted by the GaN LED is down-converted to the green-yellow range by the phosphor. The combined light that results is perceived as white by the human visual system. However, this method has a drawback in that the light produced has a spectrum with a very high correlated color temperature (CCT) and may have poor color rendering properties, especially in the red region. For white LED's to be able to compete with traditional light sources, it is desirable for the spectral power distribution (SPD) to be improved.

Quantum dots (QD's) are nanometer size semiconductors that have the property of absorbing energy in one spectral range and emitting energy in another spectral range. One of the unique features of QD's that may make them interesting in solid-state lighting applications is that the absorption and emission spectra of a QD are related to the average physical size of the QD particle. Therefore, by controlling the diameters of the QD's in a material, theoretically, a material that may produce a tailored, continuous emission spectrum from a narrow bandwidth source may be achieved.

Cadmium selenide-based (CdSe) QD's can be tuned to emit radiation across the entire visible spectrum range (380 nm to 780 nm). Therefore, it is contemplated that CdSe-based QD's are a potential down-conversion material for use in white LED applications. Because the peak wavelength of the emission spectrum of QD's is proportional to their average diameters, it may be possible to combine QD's of different diameters to produce an almost continuous spectrum white light when excited by an ultraviolet or blue LED.

The inventors have tested solid state lighting devices in which red CdSe quantum dots (QD's) (620 nm) have been layered around a blue GaN LED. These tests produced a light source with an output color that is purplish blue and a low luminous efficacy. These results are caused by the lack of output energy by these devices in the green-yellow spectral region.

For general illumination applications, it is almost always desirable to have a light source with a chromaticity near the blackbody locus. The chromaticity of these experimental solid state lighting devices may be improved by adding a certain amount of green QD's to the package. However, it has been found that green QD's have low quantum yields and high self-absorption ratios. Thus, adding green QD's to these experimental light sources may move the chromaticity value of the output light close to the blackbody locus, but the associated quantum yields and self-absorption ratios may greatly decrease package efficiency.

Exemplary embodiments of the present invention include devices and methods to produce white light that may mimic sunlight using light emitting diodes (LED's) and down-conversion materials. These exemplary embodiments use high efficiency red QD's and yellow-green phosphor as down-conversion materials. Hence, the package luminous efficacy may be increased while maintaining the desired chromaticity value.

FIG. 1 illustrates exemplary broad bandwidth light source 100 according to an exemplary embodiment of the present invention. Exemplary broad bandwidth light source 100 includes: short wavelength solid state light emitting device 102 to generate short wavelength light; QD material 104; and phosphor material 106, all of which are mounted on optical mount 108. Optical mount 108 provides mechanical support and may also act as a heat sink to help dissipate heat generated by the short wavelength solid state light emitting device 102 and the down-conversion materials. Optical mount 108 may also have a reflective coating to increase emission of the visible light out of the top surface of exemplary broad bandwidth light source 100. It is noted that, although the positions of QD material 104 and phosphor material 106 shown in FIG. 1 may be desirable, other configurations of these two material layers may be used in exemplary embodiments of the present invention. For example, the positions of QD material 104 and phosphor material 106 may be exchanged in the exemplary embodiment of FIG. 1.

Exemplary broad bandwidth light source 100 addresses the lack of green-yellow light in the spectrum of the experimental solid state light source described above by creating a packaging concept that couples both red QD's and yellow-green phosphor as down-conversion materials with a solid state blue or UV light source. As shown in FIG. 1, short wavelength solid state light emitting device 102 may be embedded within QD material 104 and phosphor material 106 may be layered on top the QD material layer.

Figure 7A:
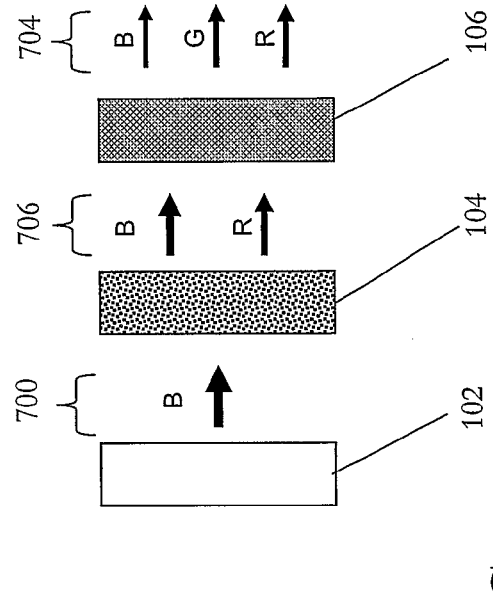
FIGS. 7A and 7B are schematic block diagrams illustrating exemplary methods of producing visible light using a short wavelength solid state light emitting device, a QD material, and a phosphor material according to an exemplary embodiment of the present invention.
Figure 7B:
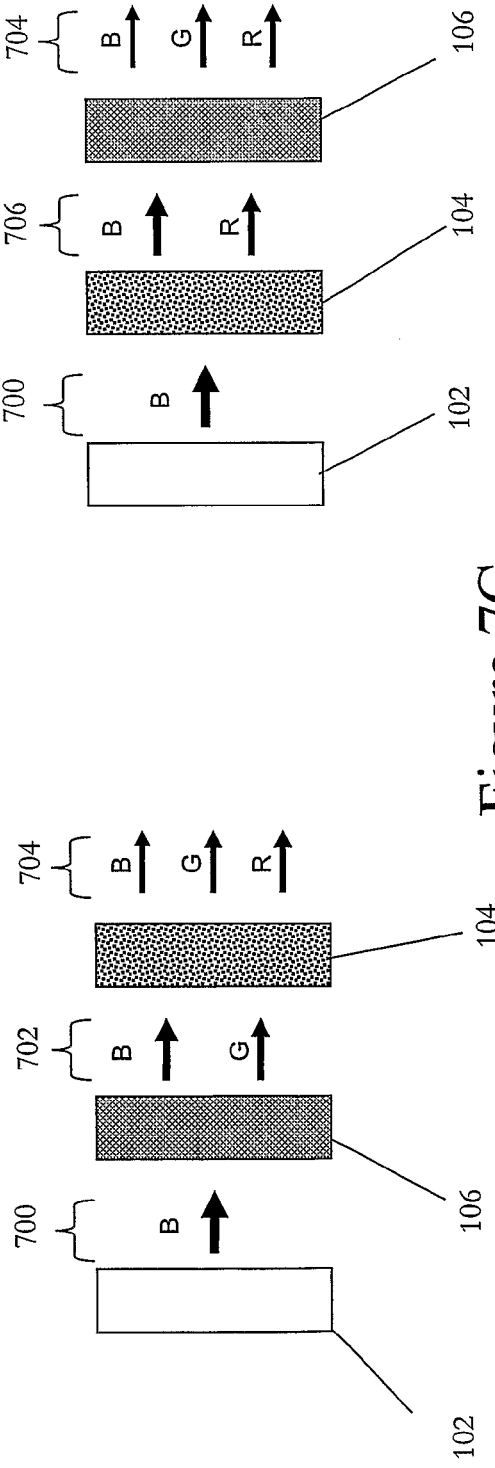
Figure 7C:
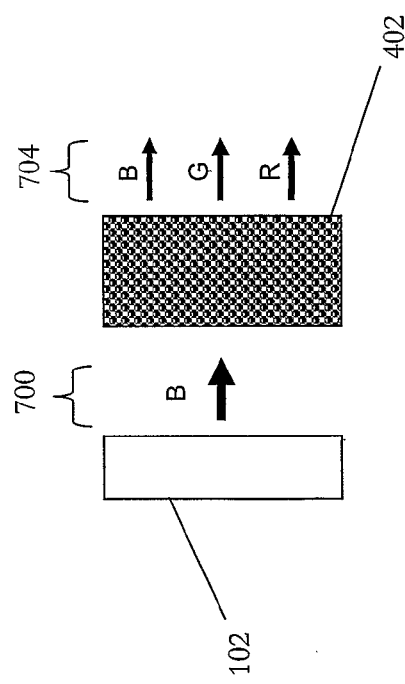
FIG. 7C is a schematic block diagram illustrating an exemplary method of producing visible light using a short wavelength solid state light emitting device and a combined QD/phosphor material according to an exemplary embodiment of the present invention.

FIGS. 7A-C schematically illustrate operation of exemplary broad bandwidth light sources. For simplicity of illustration all photons (arrows) are shown propagating forward. One skilled in the art will understand, however, that down-converted photons may be radiated in all directions and the photons of short wavelength solid state light emitting device 102 may not be collimated as shown in FIGS. 7A-C. In FIGS. 7A-C, short wavelength photons are represented by arrows marked B, mid wavelength photons are represented by arrows marked G and long wavelength photons are represented by arrows marked R. In all three Figures, photons 700 represent the short wavelength photons generated by short wavelength solid state light emitting device 102.

In the exemplary embodiment of FIG. 7A, photons 700 are incident on phosphor material 106 and some of them are absorbed by phosphor material 106 and reemitted as mid wavelength photons. Photons 702 include non-absorbed, short wavelength photons (B) that are transmitted through phosphor material 106 and emitted mid wavelength photons (G). Photons 702 are incident on QD material 104. Some of remaining short wavelength photons and some of the mid wavelength photons are absorbed by QD material 104 and reemitted as long wavelength photons. The remaining short wavelength photons and the remaining mid wavelength photons (G) are transmitted through phosphor material 106 and combine with the emitted long wavelength photons (R) to produce broad bandwidth light 704.

In the exemplary embodiment of FIG. 7B, photons 700 are incident on QD material 104 and some of them are absorbed by QD material 104 and reemitted as long wavelength photons. The remaining short wavelength photons are transmitted through QD material 104. Photons 706 include non-absorbed, short wavelength photons (B) that are transmitted through QD material 104 and emitted long wavelength photons (R). Photons 706 are incident on phosphor material 106. Some of remaining short wavelength photons are absorbed by phosphor material 106 and reemitted as mid wavelength photons. The remaining short wavelength photons (B) and the long wavelength photons (R) are transmitted through phosphor material 106 and combine with the emitted mid wavelength photons (G) to produce broad bandwidth light 704.

In the exemplary embodiment of FIG. 7C, photons 700 are incident on combined QD/phosphor material 402 and some of them are absorbed by combined QD/phosphor material 402 and reemitted as mid wavelength photons and long wavelength photons. The remaining short wavelength photons (B) are transmitted through combined QD/phosphor material 402 and combine with the emitted mid wavelength photons (G) and the long wavelength photons (R) to produce broad bandwidth light 704.

Thus, in all three illustrated embodiments, part of the short wavelength light from short wavelength solid state light emitting device 102 is absorbed by both the QD's in QD material 104 and the phosphor in phosphor material 106 (or in combined QD/phosphor material 402), which absorb the short wavelength light and reemit (i.e. down-convert) it as red and green-yellow light, respectively. Therefore, exemplary broad bandwidth light source 100 may produce an almost continuous spectrum of visible light. As a result, both the chromaticity value and luminous efficacy of exemplary broad bandwidth light source 100 may be improved.

Other benefits of this broad bandwidth light source design may include: increasing the color rendering index (CRI) of the output light; lowering the correlated color temperature (CCT) of the output light; and increasing the efficiency of the device.

Figure 2:
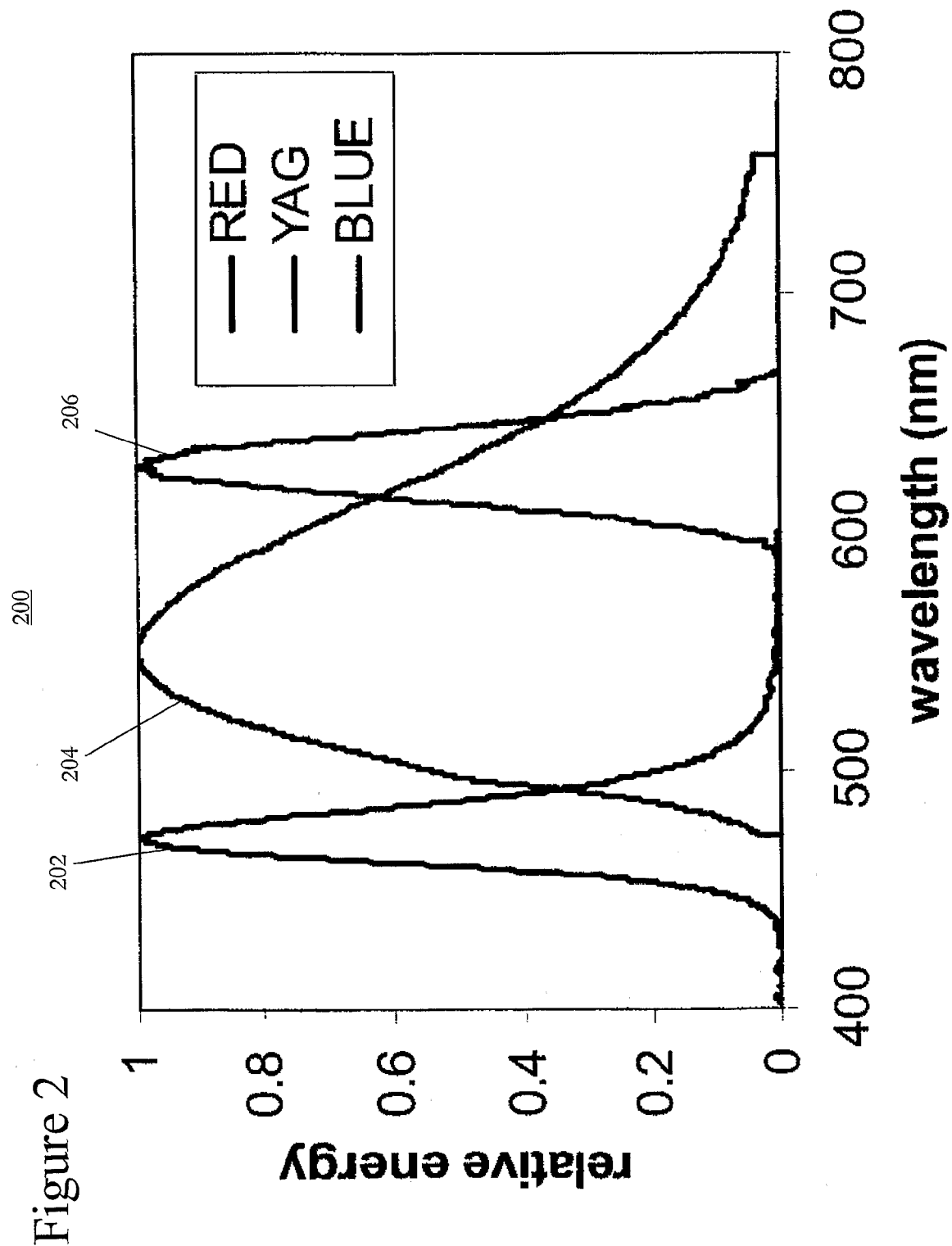
FIG. 2 is a graph illustrating exemplary spectra of a blue light emitting diode, a yellow/green phosphor material, and a red quantum dot (QD) material.
Figure 3A:
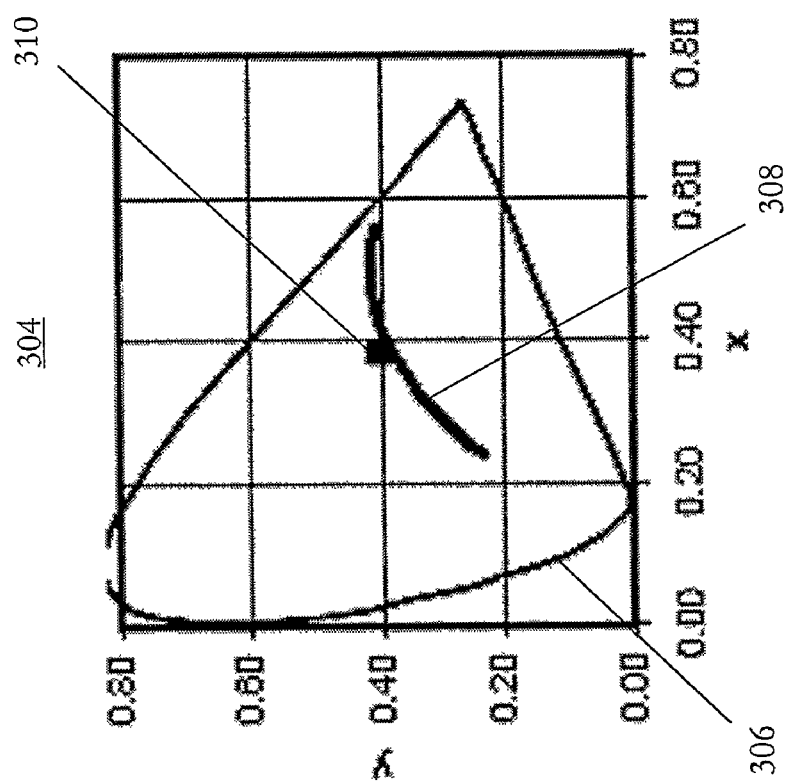
FIG. 3A is a graph illustrating the spectrum of an exemplary broad bandwidth light source according to an exemplary embodiment of the present invention.

FIG. 2 illustrates spectral graph 200, which includes three spectra. Spectrum 202 represents the spectrum of the short wavelength light generated by an exemplary short wavelength solid state light emitting device 102. Spectrum 204 represents the spectrum of the mid wavelength light emitted by an exemplary phosphor material 106. Spectrum 206 represents the spectrum of the long wavelength light emitted by an exemplary QD material 104. By properly configuring short wavelength solid state light emitting device 102, QD material 104, and phosphor material 106, the relative amounts of light from each of these spectra may be controlled to produce a visible light with desired optical properties such as chromaticity, CRI, and CCT. Spectral graph 300 in FIG. 3A illustrates exemplary combined spectrum 302 that may be produced in this manner.

Figure 3B:
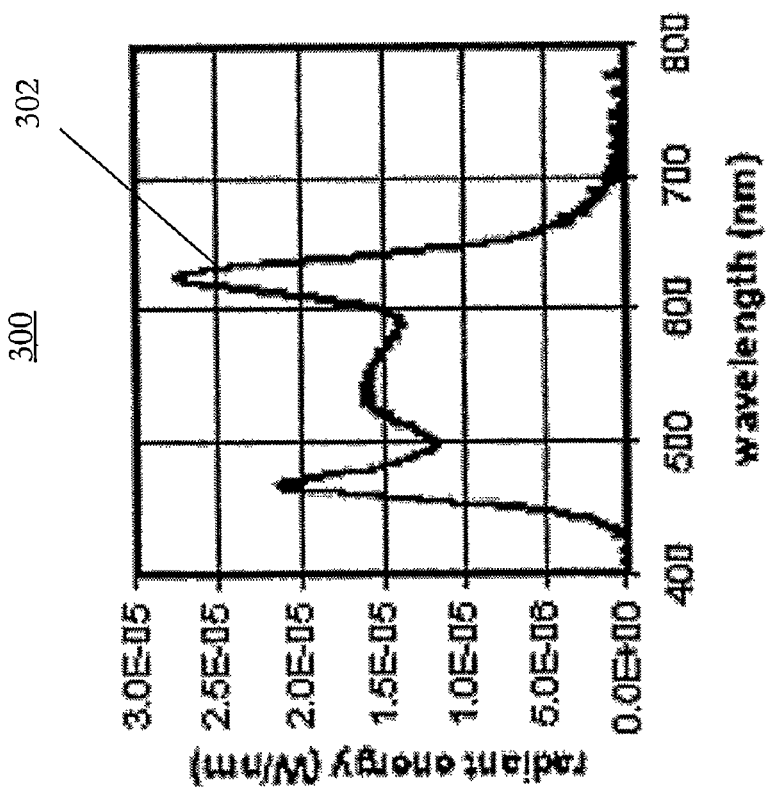
FIG. 3B is a CIE-1931 diagram illustrating the color characteristics of an exemplary broad bandwidth light source according to an exemplary embodiment of the present invention.

By varying the relative contributions of spectrum 202, spectrum 204, and spectrum 206 to the visible light emitted by exemplary broad bandwidth light source 100, the chromaticity value of the emitted light may be changed. The chromaticity value of the emitted light may also be changed by choosing a short wavelength solid state light emitting device, a QD material, and/or a phosphor material that have different spectra than those shown in FIG. 2. As noted above, a chromaticity near the black body locus has been found to be most natural to people and, thus, preferred for lighting designs. FIG. 3B shows CIE-1931 diagram 304 on which spectrum locus 306, black body locus 308, and chromaticity value 310 of exemplary combined spectrum 302 shown in FIG. 3A have been plotted. As may be seen in FIG. 3B, chromaticity value 310 of exemplary combined spectrum 302 shown in FIG. 3A is very near to black body locus 308. Proper selection and configuration of short wavelength solid state light emitting device 102, QD material 104, and phosphor material 106 may allow the chromaticity value of the visible light emitted from broad bandwidth light source 100 to be desirably set within an area bounded by about 0.01 of the x chromaticity value and about 0.01 of the y chromaticity value of the blackbody locus on a CIE-1931 diagram.

CRI is a figure of merit, on a scale of 0 to 100, used by manufacturers of fluorescent, metal halide and other nonincandescent lighting equipment to describe the visual effect of the light on colored surfaces. Natural daylight and any light source approximating a blackbody source (see color temperature) are assigned a CRI of 100. In a daylighting context, the CRI defines the spectral transmissive quality of glasses or other transparent materials. In this case, values of 95 or better are considered acceptable for allowing true color rendering. Typical cool white fluorescent lamps have a CRI of approximately 62. Fluorescent lamps having rare-earth phosphors have achieved CRI's of 80 and above. The CRI of a typical white LED based on a blue LED and YAG phosphor is between 70 and 78. Proper selection and configuration of short wavelength solid state light emitting device 102, QD material 104, and phosphor material 106 may allow the CRI of the visible light emitted from broad bandwidth light source 100 to be desirably set to be greater than about 85 or even greater than about 90.

Short wavelength solid state light emitting device 102 generates short wavelength light that desirably has a peak wavelength shorter than about 500 nm, for example between about 200 nm and about 500 nm.

The solid state light emitting device may be a light emitting diode (LED), a resonant cavity LED, or a diode laser. Examples of materials from which these devices may be formed include: InGaN; GaN; SiC; GaN on a SiC, and other semiconductor materials.

QD material 104 is optically coupled to short wavelength solid state light emitting device 102 so that it may be irradiated by a portion of the short wavelength light. In FIG. 1, QD material 104 is shown to surround short wavelength solid state light emitting device 102. One skilled in the art will understand that this is not necessary, however, as long as QD material 104 is sufficiently irradiated with the short wavelength light. Providing space between QD material 104 and short wavelength solid state light emitting device 102 may be desirable to reduce optical coupling of short wavelength light emitted by QD material 104 into short wavelength solid state light emitting device 102. Such 'back coupling' of longer wavelength light may lead to undesirable heating of short wavelength solid state light emitting device 102.

QD material 104 is adapted to absorb a fraction of incident short wavelength light and to reemit the absorbed light as long wavelength light having a peak wavelength that is longer than about 600 nm, for example between about 600 nm and about 700 nm. The full width half maximum (FWHW) of the spectrum of the long wavelength light emitted by QD material 104 may be less than about 50 nm, although in some applications a broader spectrum of long wavelength light may be desirable. A broader spectrum of long wavelength light may be particularly desirable if a component of infrared light is to be added to the visible. It is noted that a small contribution of infrared light to visible light has been found to have beneficial psychological and physical effects for some people.

QD material 104 includes a large number of QD's that are dispersed within a matrix material. This matrix material is desirably substantially transmissive to the visible light being produced by broad bandwidth light source 100. For example, the matrix material may include: UV curable clear resin; thermal curable sol-gel resin; UV curable sol-gel resin; polycarbonate; polystyrene; polymethyl methacrylate (PMMA); polyethylene; various epoxies; silicones; silica; or titania.

The QD's typically have a diameter in range of about 1.9 nm to about 10.0 nm, although this range is not limiting, and may be formed of any standard QD material, such as CdSe, ZnS, PbSe, CdTe, PbTe, ZnSe, Si, or Ge, among others.

Phosphor material 106 is adapted to absorb a fraction of incident short wavelength light and to reemit the absorbed light as a mid wavelength light having a peak wavelength between the peak wavelength of the short wavelength light and the peak wavelength of the long wavelength light, often desirably between about 500 nm and about 600 nm. The full width half maximum of the spectrum of the mid wavelength light emitted by phosphor material 106 may be less than about 150 nm, depending on the specific phosphor used.

Phosphor material 106 may includes a large number of phosphor particles that are dispersed within a matrix material. As with the matrix material of QD material 104, this matrix material is desirably substantially transmissive to the visible light being produced by broad bandwidth light source 100 and may include, for example: UV curable clear resin; thermal curable sol-gel resin; UV curable sol-gel resin; polycarbonate; polystyrene; polymethyl methacrylate (PMMA); polyethylene; various epoxies; silicones; silica; or titania. Alternatively, phosphor material 106 may be a bulk phosphor material, possibly formed into a flat substrate as shown in FIG. 1.

The phosphor particles or the bulk phosphor material may include at least one standard yellow or green phosphor, such as: $ZnS:Cu-Al$; $ZnSiO_4:Mn^{2+}$; $Sr_3SiO_5:Eu^{2+}$; $BaMgAl_{10}O_{17}:Eu^{2+}Mn^{2+}$; $SrAlO_4:Eu,Dy$; $(YGdCe)_3Al_5O_{12}:Eu$; $Sr_4Al_{14}O_{25}:Eu$; $(Ce, Tb)MgAl_{11}O_{19}$; or $(La, Ce, Tb)PO_4$, YAG:Ce, or other phosphors.

Exemplary broad bandwidth light source 100 illustrated in FIG. 1 is configured such that the short wavelength light with which phosphor material 106 is irradiated has first been transmitted through QD material 104 before it is incident on the phosphor material. Although it is contemplated that the positions of QD material 104 and phosphor material 106 may be reversed, the configuration shown in FIG. 1 may provide an advantage. As noted above, 'back coupling' of light into short wavelength solid state light emitting device 102 may lead to undesirable heating. If QD material 104 is adapted to absorb and reemit a fraction of the incident mid wavelength light as well as a fraction of the short wavelength light, the configuration shown in FIG. 1 may desirably reduce the amount of mid wavelength light that is back coupled into short wavelength solid state light emitting device 102.

Figure 4:
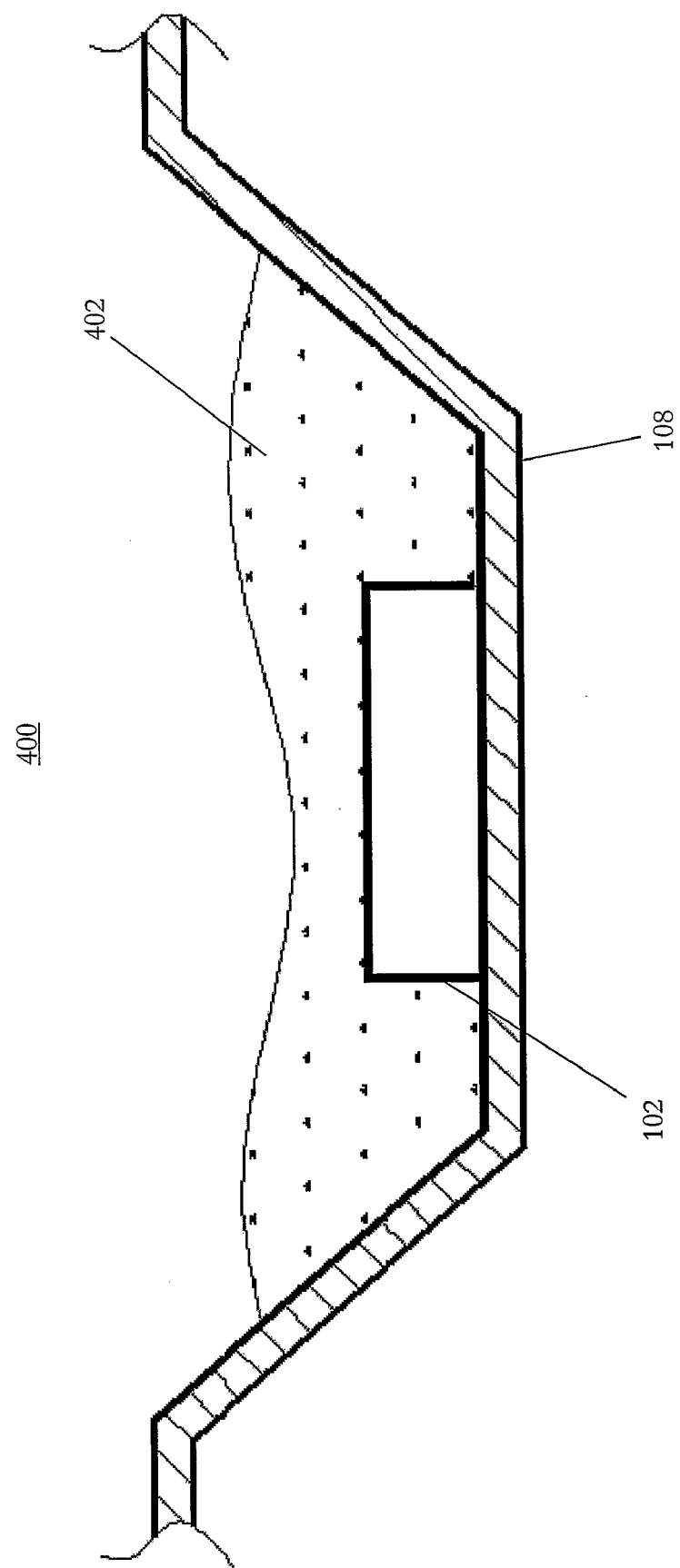
FIG. 4 is a cut away side plan drawing illustrating another exemplary broad bandwidth light source according to an exemplary embodiment of the present invention.
Figure 5:
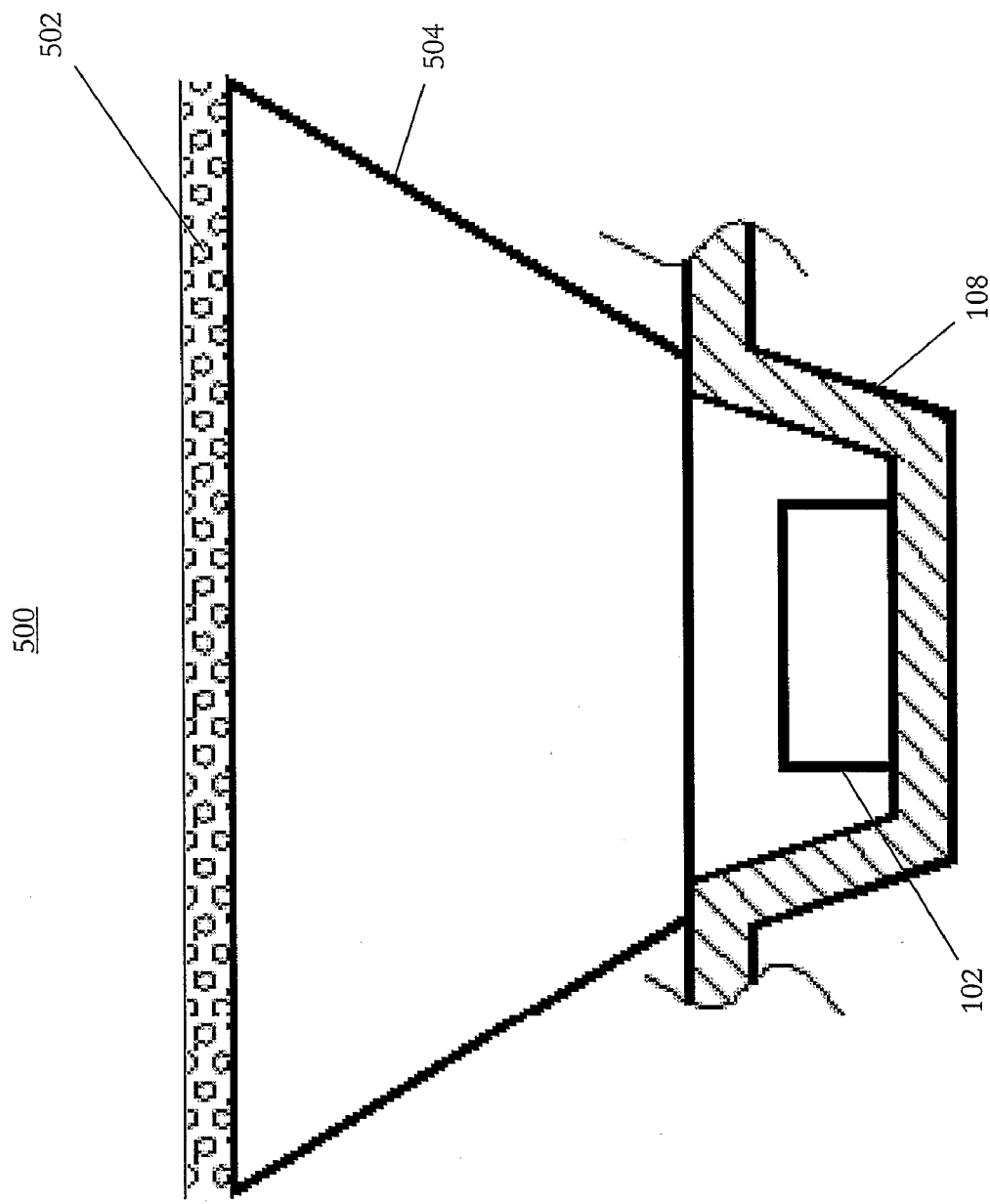
FIG. 5 is a cut away side plan drawing illustrating a further exemplary broad bandwidth light source according to an exemplary embodiment of the present invention.

FIGS. 4 and 5 illustrate alternative exemplary broad bandwidth light sources 400 and 500, respectively. Each of these alternative exemplary broad bandwidth light sources includes a combined QD/phosphor material. This combined QD/phosphor material includes a plurality of QD's and a plurality of phosphor particles that are dispersed within a matrix material that is substantially transmissive to the visible light of the exemplary broad bandwidth light source. The QD's and the phosphor particles may be dispersed separately in specific regions of the matrix material, or they may be mixedly dispersed within the matrix material.

FIG. 4 illustrates exemplary broad bandwidth light source 400 in which combined QD/phosphor material 402 is formed surrounding short wavelength solid state light emitting device 102. FIG. 5 illustrates exemplary broad bandwidth light source 500 in which combined QD/phosphor material 502 is formed on the surface of optical element 504. Optical element 504 may desirably be a light guide that may help to reduce back coupling of mid and long wavelength light from combined QD/phosphor material 502 into short wavelength solid state light emitting device 102.

An exemplary broad bandwidth light source according to the exemplary embodiment of FIG. 1 was formed using a GaN-based bare blue LED device as short wavelength solid state light emitting device 102. This blue LED was immersed in a layer of red QD's that had a peak emission wavelength of 630 nm (QD material 104) and a YAG yellow/green phosphor layer (phosphor material 106) was placed in front of the LED and QD material. Measurements of this exemplary device show that the package luminous efficacy was 211 m/W, which is close to that of a corresponding commercially available white LED device which uses a phosphor only down conversion material (231 m/W). However, the exemplary broad bandwidth light source, which produced the exemplary data shown in FIGS. 3A and 3B, had a CRI of 90 with a chromaticity value close to the blackbody locus. Thus, the inventors were able to demonstrate an exemplary broad bandwidth light source according to an exemplary embodiment of the present invention that achieves superior color quality with a minimal reduction of luminous efficacy.

Figure 6:
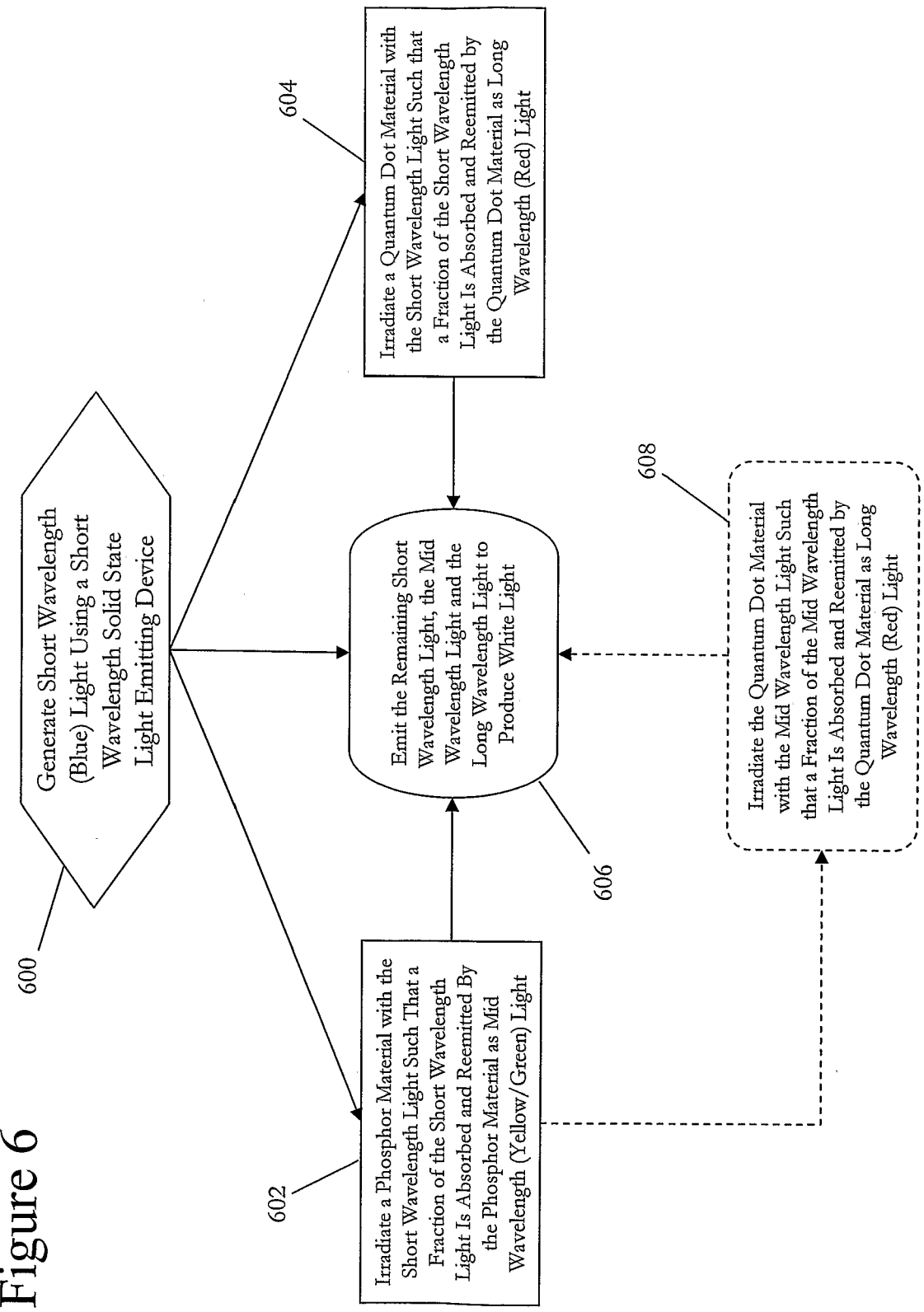
FIG. 6 is a flowchart illustrating an exemplary method of producing visible light having a chromaticity value near a blackbody locus and a color rendering index greater than about 80 according to an exemplary embodiment of the present invention.

FIG. 6 illustrates an exemplary method of producing visible light using a short wavelength solid state light emitting device, a QD material, and a phosphor material. The visible light produced by this exemplary method has a chromaticity value near the blackbody locus and a CRI greater than about 80. This method may desirably use any of the exemplary broad bandwidth light sources described above with reference to FIG. 1, 4, or 5.

Short wavelength light is generated using the short wavelength solid state light emitting device, step 600. The short wavelength light has a first spectrum with a peak wavelength that is desirably shorter than about 500 nm.

The QD material is irradiated with at least a portion of the short wavelength light such that a fraction of the short wavelength light is absorbed and reemitted by the QD material as long wavelength light, step 604. The long wavelength light has a second spectrum with a peak wavelength which is desirably longer than about 600 nm.

The phosphor material is also irradiated with at least a portion of the short wavelength light such that a fraction of the short wavelength light is absorbed and reemitted by the phosphor material as mid wavelength light, step 602. The mid wavelength light has a third spectrum with a peak wavelength between the peak wavelengths of the short wavelength light and the long wavelength light.

A remainder of the short wavelength light, at least a portion of the mid wavelength light, and at least a portion of the long wavelength light are emitted from the as exemplary broad bandwidth light source the visible light, step 606.

Alternatively, the QD material may be irradiated with at least a portion of the mid wavelength light in addition to the short wavelength light. A fraction of the mid wavelength light may be absorbed and reemitted by the QD material as additional long wavelength light, step 608.

Although the invention is illustrated and described herein with reference to specific embodiments, it is not intended to be limited to the details shown. Rather, various modifications may be made in the details within the scope and range of equivalents of the claims and without departing from the invention. In particular, one skilled in the art may understand that many features of the various specifically illustrated embodiments may be mixed to form additional exemplary broad bandwidth light sources and methods also embodied by the present invention.

What is claimed:

1. A method of producing visible light having a chromaticity value near a blackbody locus and a color rendering index greater than about 80, the visible light produced using a short wavelength solid state light emitting device, a quantum dot material and a phosphor material spaced apart from the quantum dot material, the method comprising:
   a) generating short wavelength light having a first spectrum with a first peak wavelength using the short wavelength solid state light emitting device, the first peak wavelength being shorter than about 500 nm;
   b) irradiating the quantum dot material or the spaced apart phosphor material with at least a portion of the short wavelength light such that a first fraction of the short wavelength light is absorbed and reemitted by the quantum dot material or the spaced apart phosphor material as longer wavelength light having a second spectrum with a second peak wavelength, the second peak wavelength being longer than the first peak wavelength;
   c) irradiating another of the quantum dot material or the spaced apart phosphor material with at least another portion of the short wavelength light such that a second fraction of the short wavelength light is absorbed and reemitted by the other of the quantum dot material or the spaced apart phosphor material as light having a third spectrum with a third peak wavelength, the third peak wavelength being either between the first peak wavelength and the second peak wavelength or longer than the second peak wavelength; and
   d) emitting a third fraction of the short wavelength light and combining the third fraction of the short wavelength light with at least a portion of the second wavelength light, and at least a portion of the third wavelength light as the visible light.

2. A method according to claim 1, wherein the chromaticity value of the visible light emitted in step (d) is within an area bounded by about 0.01 of an x chromaticity value and about 0.01 of a y chromaticity value of the blackbody locus on a CIE-1931 diagram.

3. A method according to claim 1, wherein the color rendering index of the visible light emitted in step (d) is greater than about 85.

4. A method according to claim 1, wherein the color rendering index of the visible light emitted in step (d) is greater than about 90.

5. A method according to claim 1, wherein the visible light emitted in step (d) has a correlated color temperature less between about 1000K and about 16000K.

6. A method according to claim 1, wherein the visible light emitted in step (d) has a correlated color temperature between about 3300K and about 3600K.

7. A method according to claim 1, wherein the first peak wavelength of the short wavelength light generated in step (a) by the short wavelength solid state light emitting device is between about 200 nm and about 500 nm.

8. A method according to claim 1, wherein the second peak wavelength of the long wavelength light emitted in step (b) by the quantum dot material is between about 600 nm and about 700 nm.

9. A method according to claim 1, wherein a full width half maximum of the second spectrum of the long wavelength light generated in step (b) by the quantum dot material is less than about 50 nm.

10. A method according to claim 1, wherein step (b) further includes irradiating the quantum dot material with at least a portion of the mid wavelength light such that a fourth fraction of the mid wavelength light is absorbed and reemitted by the quantum dot material as additional long wavelength light.

11. A method according to claim 1, wherein the third peak wavelength of the mid wavelength light emitted in step (c) by the phosphor material is between about 500 nm and about 600 nm.

12. A method according to claim 1, wherein a full width half maximum of the third spectrum of the mid wavelength light generated in step (c) by the phosphor material is less than about 150 nm.

13. A broad bandwidth light source comprising:
   a short wavelength solid state light emitting device to generate short wavelength light having a first spectrum with a first peak wavelength, the first peak wavelength being shorter than about 500 nm;
   a quantum dot material and a phosphor material optically coupled to the short wavelength solid state light emitting device, the quantum dot material or the phosphor material to be irradiated by a first portion of the short wavelength light, the quantum dot material or the phosphor material adapted to absorb a first fraction of incident light having the first spectrum and to reemit the absorbed light as longer wavelength light having a second spectrum with a second peak wavelength, the second peak wavelength being longer than the first peak wavelength peak; and
   another of the quantum dot material or the phosphor material to be irradiated by a second portion of the short wavelength light, the other of the quantum dot material or the phosphor material adapted to absorb a second fraction of incident light having the first spectrum and to reemit the absorbed light as light having a third spectrum with a third peak wavelength, the third peak wavelength either being between the first peak wavelength and the second peak wavelength or longer than the second peak wavelength,
   wherein the short wavelength solid state light emitting device, the quantum dot material, and the phosphor material are configured such that a first amount of the short wavelength light, a second amount of the longer wavelength light, and a third amount of the third wavelength light are emitted substantially coincidentally from the broad bandwidth light source as a visible light having a chromaticity value near a blackbody locus and a color rendering index greater than 80;

and further comprising an optical element optically coupled to the quantum dot material and the phosphor material for controlling back coupling of light from the quantum dot material and the phosphor material into the short wavelength solid state light emitting device.

14. A broad bandwidth light source according to claim 13, wherein the short wavelength solid state light emitting device is one of a short wavelength light emitting diode (LED), a short wavelength resonant cavity LED, or a short wavelength diode laser.

15. A broad bandwidth light source according to claim 13, wherein the first peak wavelength of the short wavelength light generated by the short wavelength solid state light emitting device is between about 200 nm and about 500 nm.

16. A broad bandwidth light source according to claim 13, wherein a full width half maximum of the first spectrum of the short wavelength light generated by the short wavelength solid state light emitting device is less than about 50 nm.

17. A broad bandwidth light source according to claim 13, wherein the quantum dot material includes a plurality of quantum dots dispersed within a matrix material that is substantially transmissive to the visible light.

18. A broad bandwidth light source according to claim 17, wherein the plurality of quantum dots include at least one of CdSe quantum dots, ZnS quantum dots, CdTe quantum dots, PbTe quantum dots, ZnSe quantum dots, Si quantum dots, Ge quantum dots, or PbSe quantum dots.

19. A broad bandwidth light source according to claim 17, wherein the matrix material includes at least one of UV curable clear resin, thermal curable sol-gel resin, UV curable sol-gel resin, polycarbonate, polystyrene, polymethyl methacrylate (PMMA), polyethylene, epoxies, silicones, silica, or titania.

20. A broad bandwidth light source according to claim 13, wherein the second peak wavelength of the long wavelength light emitted by the quantum dot material is between about 600 nm and about 700 nm.

21. A broad bandwidth light source according to claim 13, wherein a full width half maximum of the second spectrum of the long wavelength light generated by the quantum dot material is less than about 50 nm.

22. A broad bandwidth light source according to claim 13, wherein:

the quantum dot material or the phosphor material is further optically coupled to the other of the quantum dot material or the phosphor material to be irradiated by a portion of the longer wavelength light; and the other of the quantum dot material or the phosphor material is further adapted to absorb a third fraction of incident light having the first spectrum.

23. A broad bandwidth light source according to claim 22, wherein the quantum dot material is disposed within the broad bandwidth light source such that the second portion of the short wavelength light with which the phosphor material is irradiated is transmitted through the quantum dot material before being incident on the phosphor material.

24. A broad bandwidth light source according to claim 13, wherein the phosphor material includes a plurality of phosphor particles dispersed within a matrix material that is substantially transmissive to the visible light.

25. A broad bandwidth light source according to claim 24, wherein the plurality of phosphor particles include at least one of ZnS:Cu—Al; $ZnSiO_4:Mn^{2+}$; $Sr_3SiO_5:Eu^{2+}$; $BaMgAl_{10}O_{17}:Eu^{2+}Mn^{2+}$; $SrAlO_4:Eu,Dy$; $(YGdCe)_3Al_5O_{12}:Eu$; YAG:Ce; $Sr_4Al_{14}O_{25}:Eu$; $(Ce, Tb)MgAl_{11}O_{19}$; YAG:Ce; or $(La, Ce, Tb)PO_4$.

26. A broad bandwidth light source according to claim 24, wherein the matrix material includes at least one of UV curable clear resin, thermal curable sol-gel resin, UV curable sol-gel resin, polycarbonate, polystyrene, polymethyl methacrylate (PMMA), polyethylene, epoxies, silicones, silica, or titania.

27. A broad bandwidth light source according to claim 13, wherein the phosphor material includes at least one of bulk ZnS:Cu—Al; bulk $ZnSiO_4:Mn^{2+}$; bulk $Sr_3SiO_5:Eu^{2+}$; bulk $BaMgAl_{10}O_{17}:Eu^{2+}Mn^{2+}$; bulk $SrAlO_4:Eu,Dy$; bulk $(YGdCe)_3Al_5O_{12}:Eu$; bulk $Sr_4Al_{14}O_{25}:Eu$; bulk $(Ce, Tb)MgAl_{11}O_{19}$; or bulk $(La, Ce, Tb)PO_4$.

28. A broad bandwidth light source according to claim 13, wherein the third peak wavelength of the longer wavelength light emitted by the phosphor material is between either about 500 nm and about 600 nm or about 600 nm and 700 nm.

29. A broad bandwidth light source according to claim 13, wherein a full width half maximum of the third spectrum of the longer wavelength light generated by the phosphor material is less than about 150 nm.

30. A broad bandwidth light source according to claim 13, wherein the short wavelength solid state light emitting device, the quantum dot material, and the phosphor material are configured such that the chromaticity value of the visible light emitted from the broad bandwidth light source is within an area bounded by about 0.01 of an x chromaticity value and about 0.01 of a y chromaticity value of the blackbody locus on a CIE-1931 diagram.

31. A broad bandwidth light source according to claim 13, wherein the short wavelength solid state light emitting device, the quantum dot material, and the phosphor material are configured such that the color rendering index of the visible light emitted from the broad bandwidth light source is greater than about 85.

32. A broad bandwidth light source according to claim 2, wherein the short wavelength solid state light emitting device, the quantum dot material, and the phosphor material are configured such that the color rendering index of the visible light emitted from the broad bandwidth light source is greater than about 90.

33. A broad bandwidth light source according to claim 13, wherein the short wavelength solid state light emitting device, the quantum dot material, and the phosphor material are configured such that the color rendering index of the visible light emitted from the broad bandwidth light source has a correlated color temperature between about 1000K and about 16000K.

34. A broad bandwidth light source according to claim 13, wherein the short wavelength solid state light emitting device, the quantum dot material, and the phosphor material are configured such that the color rendering index of the visible light emitted from the broad bandwidth light source has a correlated color temperature between about 3300K and about 3600K.

35. A broad bandwidth light source for producing visible light having a chromaticity value near a blackbody locus and a color rendering index greater than about 80, the broad bandwidth light source comprising:

means for generating short wavelength light having a first spectrum with a first peak wavelength, the first peak wavelength being shorter than about 500 nm;

means for absorbing and reemitting a first fraction of the short wavelength light as longer wavelength light having a second spectrum with a second peak wavelength, the second peak wavelength being longer than the first peak wavelength; and means for absorbing and reemitting a second fraction of the short wavelength light as light having a third spectrum with a third peak wavelength, the third peak wavelength being either between the first peak wavelength and the second peak wavelength or longer than the second peak wavelength, wherein a third fraction of the short wavelength light, at least a portion of the longer wavelength light, and at least a portion of the light having the third spectrum are emitted as the visible light;

and further comprising an optical element optically coupled to the means for absorbing and reemitting a first fraction of the short wavelength light and to the means for absorbing and reemitting a second fraction of the short wavelength light for controlling back coupling of light from the means for absorbing and reemitting a first fraction of the short wavelength light and the means for absorbing and reemitting a second fraction of the short wavelength light into the means for generating short wavelength light.

36. The broad bandwidth light source of claim 13, wherein the phosphor material is separate from the quantum dot material.

37. The broad bandwidth light source of claim 13, wherein the phosphor material is spaced apart from the quantum dot material.

38. A broad bandwidth light source comprising:

a short wavelength solid state light emitting device to generate short wavelength light having a first spectrum with a first peak wavelength, the first peak wavelength being shorter than about 500 nm;

a quantum dot material having a plurality of quantum dots and a phosphor material having a plurality of phosphor particles, the plurality of quantum dots and the plurality of phosphor particles being optically coupled to the short wavelength solid state light emitting device to be irradiated by a first portion of the short wavelength light and mixedly dispersed within a matrix material that is substantially transmissive to visible light, the mixedly dispersed plurality of quantum dots and plurality of phosphor materials adapted to absorb a first fraction of incident light having the first spectrum and reemit the absorbed light as mid wavelength light and long wavelength light, wherein the mid wavelength light and the long wavelength light combine with a second fraction of incident light that is transmitted through the mixedly dispersed plurality of quantum dots and plurality of phosphor particles to produce broad bandwidth light as a visible light as visible light; and an optical element optically coupled to the mixedly dispersed plurality of quantum dots and plurality of phosphor particles for controlling back coupling of light from the mixedly dispersed plurality of quantum dots and plurality of phosphor particles into the short wavelength solid state light emitting device.

* * * * *